(12) United States Patent
Goebel

(10) Patent No.: US 6,188,617 B1
(45) Date of Patent: Feb. 13, 2001

(54) REUNDANCY CIRCUIT FOR SEMICONDUCTOR MEMORIES

(75) Inventor: Holger Goebel, Hamburg (DE)

(73) Assignee: Infineon Technologies AG, Munich (DE)

( * ) Notice: Under 35 U.S.C. 154(b), the term of this patent shall be extended for 0 days.

(21) Appl. No.: 09/115,618

(22) Filed: Jul. 13, 1998

(30) Foreign Application Priority Data

Jul. 10, 1997 (DE) .............................................. 197 29 579

(51) Int. Cl.⁷ ...................................................... G11C 7/00
(52) U.S. Cl. ...................................... 365/200; 365/230.03
(58) Field of Search .............................. 365/200, 230.03, 365/225.7, 96

(56) References Cited

U.S. PATENT DOCUMENTS 5,359,560 * 10/1994 Suh ....................................... 365/200
5,459,690 * 10/1995 Rieger ................................... 365/200

FOREIGN PATENT DOCUMENTS 0 442 319 A2   8/1991   (EP) .
0 554 901 A2   8/1993   (EP) .

* cited by examiner

Primary Examiner—A. Zarabian
(74) Attorney, Agent, or Firm—Herbert L. Lerner; Laurence A. Greenberg; Werner H. Stemer

(57) ABSTRACT

A redundancy circuit for semiconductor memories having word lines organized in segments. If a defective word line appears in a segment then, by virtue of inter-segment redundancy, a redundant word line in the same or in a different segment can be activated by a segment select signal. Fuse sets assigned to the respective segments provide output signals. The segment select signal is generated directly by evaluating the fuse set output signals.

1 Claim, 1 Drawing Sheet

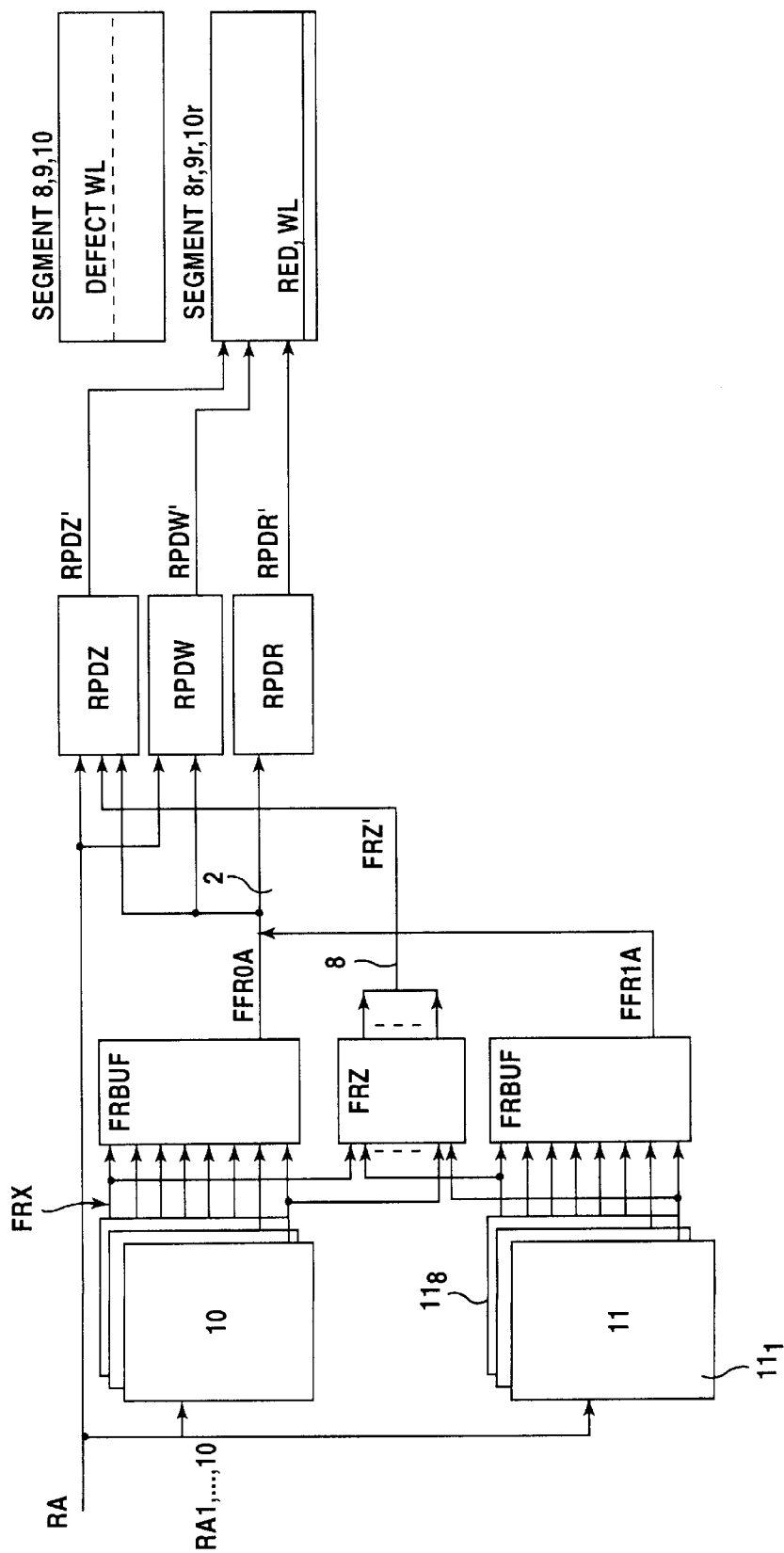

REUNDANCY CIRCUIT FOR SEMICONDUCTOR MEMORIES

BACKGROUND OF THE INVENTION

Field of the Invention

The present invention relates to a redundancy circuit for semiconductor memories having word lines organized in segments. When a word line is defective in a segment, a redundant word line in the same or in a different segment can be activated by virtue of inter-segment redundancy by a segment select signal and through fuse sets assigned to the respective segments.

The word lines of semiconductor memories are usually organized in segments. If so-called inter-segment redundancy is provided, it is possible, given the occurrence of a defective word line, to use redundant word lines both from the same segment in which the defective word line is present and from neighboring segments in order to replace the defective word line.

A problem that arises in the case of inter-segment redundancy is that, if appropriate, the activation of the segment with the defective word line is intended to be prevented and, instead of this, the segment in which the redundant word line is located is intended to be activated. Possibly, this may also be the segment with the defective word line if that segment additionally contains the redundant word line.

In order not to lose any access time, the decoding of the signal which selects the segment to be activated, that is to say the decoding of the segment select signal, must take place very rapidly in such a redundancy circuit for semiconductor memories.

To date, segment select signals which specify the segment with the redundant word line have been generated in existing redundancy circuits by evaluating fuse output signals with the aid of the original row addresses. In other words, an additional logic stage is necessary here in order logically to combine the fuse output signal with the address information.

SUMMARY OF THE INVENTION

It is accordingly an object of the invention to provide a redundancy circuit for semiconductor memories, which overcomes the above-mentioned disadvantages of the prior art devices and methods of this general type and which permits segment select signals to be generated, given the occurrence of defective word lines, without such an additional logic stage.

With the foregoing and other objects in view there is provided, in accordance with the invention, a redundancy circuit in a semiconductor memory with word lines organized in segments. The redundancy circuit provides for inter-segment redundancy for selecting a redundant word line upon an occurrence of a defective word line in one of the segments of the semiconductor memory, wherein the redundant word line is selected from the segment containing the defective word line or from a different segment. The improvement comprises: a plurality of fuse sets assigned to respective segments of the semiconductor memory, and a device connected to the fuse sets for evaluating the fuse set output signals and issuing segment select signals activating the redundant word line in the segment containing the defective word line or in the different segment based on the fuse set output signals thus evaluated.

In accordance with a concomitant feature of the invention, there is provided a circuit connected to receive the fuse set output signals from the fuse sets. In the event of a correspondence between an applied row address and a fused address of the fuse set assigned to a given segment, the circuit activates a signal which is assigned to an address of the given segment, overwrites the segment select signal generated from the row address, and activates the redundant word line.

In other words, the above-noted objects are satisfied by the fact that the segment select signal can be generated by evaluating the output signal of the fuse sets. Specifically, if a correspondence is determined between an applied row address and the fused address of the fuse set assigned to a segment, a circuit connected downstream of the fuse sets activates a signal which is assigned to the address of that segment and overwrites a segment select signal generated from the row address and activates the redundant word line.

The redundancy circuit according to the invention thus converts the output signals of the fuse sets directly, that is to say without the assistance of row addresses, into segment select signals. As a result, logic combination of the fuse output signals with the address information is unnecessary and a logic stage is obviated. Consequently, access time is not increased in spite of the flexible inter-segment redundancy, and the segment to be activated can be decoded very rapidly by means of the segment select signal generated directly from the fuse output signal.

Other features which are considered as characteristic for the invention are set forth in the appended claims.

Although the invention is illustrated and described herein as embodied in a redundancy circuit for semiconductor memories, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The single FIGURE of the drawing is a block diagram of the novel redundancy circuit for semiconductor memories.

DESCRIPTION OF THE PREFERRED EMBODIMENTS

Referring now to the FIGURE of the drawing in more detail, there is seen a block circuit with two blocks 10, 11, which each comprise eight fuse sets for segments "000" to "111". Each fuse set encompasses ten fuses and one master fuse. The master fuse serves, as is known, to activate the redundancy and to switch the corresponding block on. In the block 11, for example, a fuse set $11_1$ is assigned for fuses for "000", while a fuse set 118 is provided for fuses for "111".

Row addresses RA and RA1, . . . , RA10, which are fed to the blocks 10, 11, are present at the input of the redundancy circuit. The row address RA is fed to a segment select signal block RPDZ and to a word line select signal block RPDW, which generate a segment select signal RPDZ' and a word line select signal RPDW', respectively. The segment to be activated, that is to say, for example, a segment "segment 8, 9, 10", is selected by the segment select signal RPDZ', which is generated from the row addresses RA8, RA9, RA10. The signal RPDW', which is derived from the addresses RA0, . . . , RA7, determines which word line WL within the segment "segment 8, 9, 10" is activated.

The signals RPDW'—the signals for selection of a word line within the activated segment—are initially present at the row decoders after an RAS command. Immediately afterwards, one of the segment select signals RPDZ' becomes active, so that the activation of the corresponding word line WL can begin.

In the case of inter-segment redundancy, it may now happen that the redundant word line "Red. WL" is located in a different segment, in other words, for example, a segment "segment 8r, 9r, 10r", from the segment "segment 8, 9, 10" determined by the row addresses RA8, RA9, RA10. In this case, it is then necessary to generate a new segment select signal RPDZ', which starts the activation of the redundant word lines "Red. WL" in the new segment "segment 8r, 9r, 10r". At the same time, the activation of the addressed word line "defect. WL" in the segment "segment 8, 9, 10" must be prevented.

A coherent block of the semiconductor memory contains eight segments, for example, whose redundant word lines can be freely utilized in order to repair defective word lines in any desired segment of these eight segments by means of inter-segment redundancy. In this case, each segment is assigned exactly two fuse sets, that is to say two redundant word lines are present in each segment.

If the applied row address RA corresponds to one of the fused addresses, in other words if there is a defective word line "defect. WL", then one of the 16 output signals FRX of the blocks 10, 11 of the fuses becomes active. This means, for example, that the signal FRX becomes "low", if a fused address is ascertained. The signals FRX are fed to blocks FRBUF, which serve as buffers for the fuse output signals FRX and in which a check is made to see whether it is necessary to use a redundant word line "Red. WL", which is the case when a signal FRX is low. The blocks FRBUF activate a respective signal FFR0A and FFR1A, with the result that the redundant word line "Red. WL" is activated instead of the originally addressed word line "defect. WL". Specifically, the signals FFR0A and FFR1A are "high" if an address is fused. They switch off, via the segment select signal block RPDZ and via the word line select signal block RPDW, the signal RPDZ' for selecting the segment with the defective word line and the signal RPDW' for selecting the word line "defect. WL", respectively, and enable the redundant word line "Red. WL" with the aid of a signal RPDR' via a block RPDR. The signal RPDR' thus selects the redundant word line in the segment "segment 8r, 9r, 10r".

The segment select signal RPDZ' is generated by evaluation of the output signals FRX of the blocks 10, 11, as has already been explained above: if the applied row address RA corresponds for example to the fused address of the fuse set assigned to the segment "segment 8r, 9r, 10r", then a signal FRZ', which corresponds to the address 8r, 9r, 10r, is activated in the circuit FRZ. In the case of redundancy, therefore, this signal FRZ' selects a segment and overwrites the regularly selected signal in the segment select signal block RPDZ. It is high, for example, if redundancy does not obtain, and low if redundancy occurs. The signal FRZ' is thus fed to the segment select signal block RPDZ where it overwrites the segment select signal generated from the original row address 8, 9, 10.

Consequently, a redundant word line "Red. WL" in the segment "segment 8r, 9r, 10r" is activated. The actual activation of one of the two redundant word lines present in that segment, i.e. which word line is actually activated, depends on which of the two groups of fuse sets was subject to the correspondence between applied and fused address. That is in turn determined by the signals FFR0A and FFR1A.

I claim:

1. In a semiconductor memory with word lines organized in segments, a segment select signal block, a word line select signal block, and a redundancy circuit with inter-segment redundancy for selecting a redundant word line upon an occurrence of a defective word line in one of the segments of the semiconductor memory, wherein the redundant word line is selected from the segment containing the defective word line or from a different segment, the improvement which comprises:

a plurality of fuse sets assigned to respective said segments of the semiconductor memory, said fuse sets outputting fuse set output signals;

a device connected to said fuse sets for evaluating the fuse set output signals and issuing segment select signals activating the redundant word line in the segment containing the defective word line or in the different segment based on the fuse set output signals thus evaluated; and a circuit connected to receive the fuse set output signals from said fuse sets, wherein, in the event of a correspondence between an applied row address and a fused address of said fuse set assigned to a given segment containing said redundant word line, said circuit activates a signal which is assigned to an address of the given segment, overwrites the regularly selected segment select signal generated from the row address in the segment select signal block, said circuit to receive the fuse set output signals further comprising a buffer at the output of each fuse set, each buffer receiving the output signals of the respective fuse set, whereby in the buffers a check is made to see whether it is necessary to use a redundant word line, which is the case when a fuse is activated.

* * * * *